TWO RESIST METHOD FOR PRINTED CIRCUIT STRUCTURE

Filed March 26, 1971

INVENTOR
KENNETH F. GREENE

BY

ATTORNEY

United States Patent Office 3,745,094
Patented July 10, 1973

1 2

3,745,094
TWO RESIST METHOD FOR PRINTED CIRCUIT STRUCTURE

Kenneth F. Greene, Poughkeepsie, N.Y., assignor to International Business Machines Corporation, Armonk, N.Y.

Filed Mar. 26, 1971, Ser. No. 128,397
Int. Cl. H05k 3/06
U.S. Cl. 204—15 5 Claims

ABSTRACT OF THE DISCLOSURE

An improved method is provided for plating conductive material in a predetermined pattern on a conductive layer that is thereafter etched to the same pattern as the plated material or is etched to the pattern that extends beyond the region of plating. Two layers of photosensitive resist are applied one over the other to the conductive layer. The first or innermost resist layer is developed to mask the conductive layer in the areas that are later to be removed by etching. The second resist layer is developed to expose regions of the conductive layer that are to be plated. After the plating has been completed, the second resist is removed. The structure is then plated with an etch resistant metal in areas not masked by the first resist. The first resist is removed and the unwanted regions of the conductive layer are etched away. This method is particularly useful for plating conductive studs in a multi-layer printed circuit structure. The sides of the studs are protected by the plated resist to prevent the studs from being etched in the etch step.

INTRODUCTION

Figure 1:
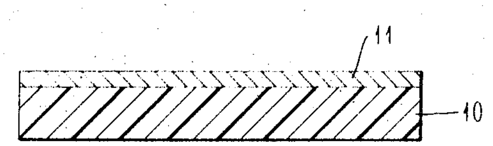

It is common to form printed circuit structures by laminating or otherwise applying a continuous layer of a conductor such as copper to a dielectric substrate and then etching away unwanted regions of copper to leave a selected pattern of conductors. In some structures of this type, electrical components are mounted on the conductors without additional operations on the conductive layer. By contrast, in devices of the type to which this invention applies, an electroplating or other deposition step is performed on the conductive layer. For example, the conductive layer may be made very thin to reduce the amount of etching required, and additional conductive material (typically copper) may be plated within the desired pattern on the conductive layer to provide additional thickness for the conductors. In another example of both a plating step and an etch step, the conductive layer may be etched in the selected pattern and another pattern may be plated to extend vertically above the conductive layer; for example, to form conductive studs in a multi-layer device.

For electroplating on the conductive layer, electrical conductivity must be provided throughout the region that is to be plated. Ordinarily, in the pattern produced by the etch step, some of the conductors are physically and conductively isolated and thus will not receive the current necessary for electroplating. One solution proposed in the prior art has been to cover both the etched pattern of conductors and the intervening dielectric surface of the substrate with a thin, readily etchable, conductive film which forms a temporary electrical connection between elements of the conductive pattern. A photoresist is formed on the temporary conductive film and is developed according to the desired plating pattern. After the plating step, the resist is removed and the temporary conductive film is etched away in a step that does not significantly damage the plated regions or the conductors. In the method just described, there is a problem that the conductivity between conductors is limited by the amount of the temporary conductive material that can be removed in the etch step without undesirably etching the plated patterns. Conductivity may be poor so that the plating is undesirably uneven. Because of these problems in establishing electrical connections to an already etched pattern of conductors, it is advantageous to plate the selected pattern on the conductive layer before the conductive layer is etched. That is, after the second or plated layer of the structure is formed, the first layer is selectively etched. A problem occurs in protecting the plated region during the etch operation. In one solution proposed by the prior art, the conductive layer is masked for the plating operation, the plating is completed, and the plating operation is followed by a further plating of an etch resistant material. When the resist is removed for the etch step on the conductive layer, the plated etch resist applied to the plated regions remains to protect the plated regions during the following etch step. For certain kinds of structures the plated regions are not effectively protected by this method and the unprotected locations are damaged by etching. An object of this invention is to provide a new and improved method that is particularly suited to plated structures of this type.

THE INVENTION

According to this invention, a relatively thin layer of resist is applied to a conductive sheet to mask areas that are to be removed later in an etch step that forms a pattern of individual conductors. Next, a second layer of resist is applied that is of a thickness for the plating operation. This second resist layer is many times the thickness of the first resist layer. The second resist layer is exposed and developed to expose areas of the conductive surface where plating is to occur and to mask areas that are not to be plated. That is, the second mask may coincide with the first mask or it may mask additional areas of the conductive layer that were uncovered during development of the first resist. The plating step then forms raised conductive regions on the conductive sheet. The second resist is removed to expose all of the plated regions and any regions of the conductive layer that were not masked by the first resist. The exposed conductive regions are then plated with a third resist. This third resist covers not only the outwardly facing surfaces of the conductive sheet and plated regions but also the sides of the plated regions except where the sides are masked by the thin edge of the first resist layer. The first resist layer is then removed. At this point in the method, an etch resist covers all of the plated regions except for a region at the base of each of the plated regions where the first resist has prevented plating the third resist. The conductive sheet is then etched. Since the first resist is much thinner than the second resist, only a very small portion of the plating and the conductive pattern is undesirably etched in this step.

This method is readily adaptable to high speed operation and it provides close tolerances that permit very small conductive regions to be located close together.

THE DRAWING

The drawing shows successive steps in the method of this invention.

THE METHOD OF THE DRAWING

The drawing shows in sections a printed circuit structure at representative steps in the preferred method of this invention. FIG. 1 shows, as a starting step, a conventional substrate 10 supporting a conductive layer 11 which may be copper. Layer 11 is made thick enough to provide the conductivity needed for satisfactorily uniform electroplating (in a step described later). For the specific structure of the drawing, layer 11 is made thick enough to provide suitable conductivity in the completed structure.

Figure 2:
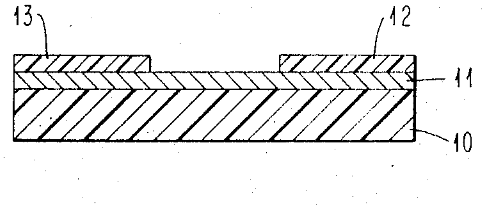

In the next step, not shown in the drawing, a thin photoresist is applied to layer 11. The resist is conventionally exposed according to the pattern of conductors that is to be formed by etching layer 11 and developed. FIG. 2 illustrates representative resist regions 12, 13 and an intervening region where layer 11 is exposed by the developing step. In the completed structure of FIG. 7, the regions of layer 11 that are masked by resist portions 12, 13 in FIG. 2 are to be removed and the region that is exposed in FIG. 2 is to be retained as part of the circuit structure.

Figure 3:
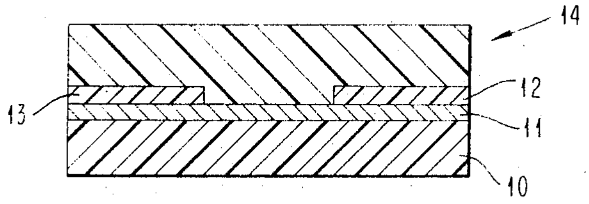
Figure 4:
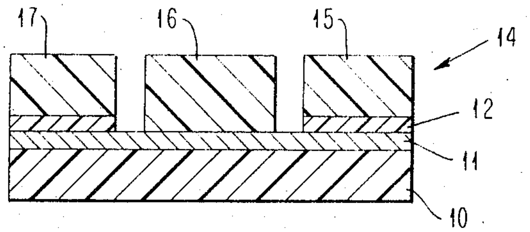
Figure 5:
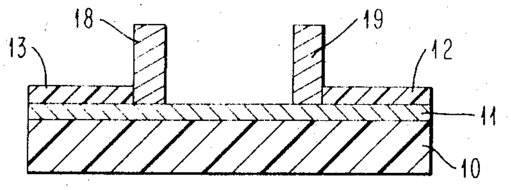

FIG. 3 shows a second resist 14 applied over the first resist portions 12, 13 and the exposed region of layer 11. As FIG. 4 shows, the second resist layer 14 is exposed and developed to leave regions 15, 16, 17 and to expose regions of the conductive layer 11 where plating is to occur. In a step not shown in the drawing, the structure of FIG. 4 is electroplated. The conductive layer 11 forms an electrode for the electroplating step and the resist layers define the vertical size of the plated region. FIG. 5 shows the structure after the plating step with the second resist 14 of FIGS. 3 and 4 removed. Conductive studs 18 and 19 formed in the plating step are physically and electrically connected to the conductive layer 11.

Figure 6:
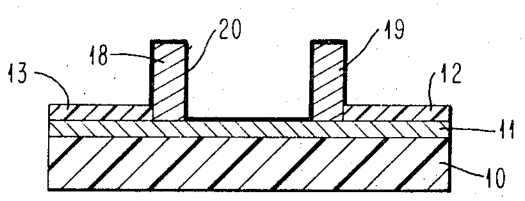
Figure 7:
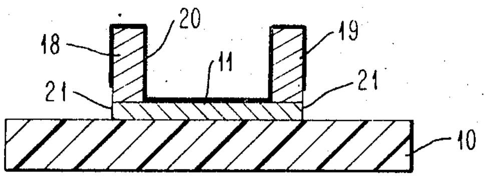

As FIG. 6 shows, the structure of FIG. 5 is given a plating layer 20 in its exposed areas. For example, layer 20 may be chromium deposited by electroplating. Thus, in the structure of FIG. 6, the conductive regions that are to be removed by etching are still covered by portions 12 and 13 of the first resist layer and regions that are not to be removed are covered by resist 20. The first resist layer portions 12 and 13 are removed and the structure is etched to produce the completed circuit structure shown in FIG. 7. As FIG. 7 shows, the conductive regions are completely masked by layer 20 except at points 21 where the resist portions 12 and 13 limited the operation of plating layer 20 and where normal undercutting occurs in etching conductive layer 11. The second resist layer 14 is made much thicker than the first layer so that the region 21 where undercutting may occur is very small and the etch operation does not significantly reduce the conductance of the studs or the conductors of layer 11. Thus, the method of this invention permits the conductive layer 11 to be kept intact for the electroplating operation and prevents the subsequent etch operation from damaging the plated structure.

This method can be used with a wide variety of commercially available resists and related processing materials. Preferably, the first resist is a product commercially available under the trademark KTFR a cyclized poly-cis-isoprene, and the second resist is commercially available under the trademark Riston a polymethyl methacrylate. These materials provide the desired thickness ratio for minimizing the exposed area 21 shown in FIG. 7. In addition, the materials are compatible in the two resist method and ordinary resist developing and stripping materials have been found compatible in the steps where the structure has both resists. In addition, the fact that the second resist covers all regions 12 and 13 of the first resist simplifies the relationship of the two resists in the developing steps.

The method is also useful where the plated pattern represented by studs 18 and 19 is identical to the conductor pattern in layer 11. For example, layer 11 may be thick enough for satisfactory electroplating but not as thick as the desired conductors in the completed structure. The thin layer can be plated in the selected pattern and then protected by a plated layer 20 in a way that is shown in the drawing for the left hand part of stud 18 and the right hand part of stud 19 where the patterns of the studs and the conductive layer coincide.

From this description of a preferred embodiment of the invention, those skilled in the art will recognize other applications for the invention and variations in detail within the scope of the claims.

What is claimed is:

1. A method for forming an electrical printed circuit structure including a dielectric substrate and a conductive layer formed on said substrate in a thickness to form electrodes in an electroplating step, comprising, forming on said conductive layer a first relatively thin resist in a pattern according to areas of said layer to be removed in an etch operation to be performed later, forming on said first resist a second relatively thicker resist according to a pattern of conductive material to be electroplated on said conductive layer, electroplating said material on said layer in the pattern formed by said second resist and thereafter removing said second resist while maintaining said first resist, applying a third resist to regions unmasked by said first resist, and removing said first resist and performing said etch operation on said conductive layer in regions unmasked by said third resist, whereby said electroplated region is sharply defined by said second resist and is extensively protected during said etch operation by said third resist.

2. The method of claim 1 wherein said second resist is many times the thickness of said first resist.

3. The method of claim 2 wherein said third resist is a plated metal resistant to said etch.

4. The method of claim 3 wherein said second resist pattern coincides at selected points with the pattern of said first resist and covers areas of said conductive layer uncovered by said first resist at other points for forming said conductive layer into a layer of interconnections and for forming said electroplated material into studs suitable for connecting said selected points of said layer in a multilayer device.

5. The method of claim 4 wherein said second resist covers all remaining regions of said first resist.

References Cited

UNITED STATES PATENTS

| | | | |
|---|---|---|---|
| 3,424,658 | 1/1969 | Norton | 204—15 |
| 3,506,441 | 4/1970 | Gottfried | 96—36.2 |

JACOB H. STEINBERG, Primary Examiner

U.S. Cl. X.R.

156—11, 3; 96—36